United States Patent [19]

Blaess

[11] Patent Number: 5,025,221

[45] Date of Patent: Jun. 18, 1991

[54] METHOD FOR MEASUREMENT OF ATTENUATION AND DISTORTION BY A TEST OBJECT

[75] Inventor: Gerhard Blaess, Olching, Fed. Rep. of Germany

[73] Assignee: Siemens Aktiengesellschaft, Berlin and Munich, Fed. Rep. of Germany

[21] Appl. No.: 269,991

[22] Filed: Jun. 3, 1981

[30] Foreign Application Priority Data

Jun. 27, 1980 [DE] Fed. Rep. of Germany ....... 3024346

[51] Int. Cl.$^5$ .............................................. H04B 3/46
[52] U.S. Cl. ..................................... 324/603; 364/487
[58] Field of Search ..................................... 367/39–42, 367/189; 324/57, 77 E, 603; 73/664, 668; 375/10; 370/21, 23; 364/851, 485, 487, 553, 576, 571, 159, 851, 726, 717

[56] References Cited

U.S. PATENT DOCUMENTS

| | | | |
|---|---|---|---|
| 3,102,928 | 9/1963 | Schroeder | 324/77 E |
| 3,471,779 | 10/1969 | Ley | 364/553 |
| 3,875,500 | 4/1975 | Fletcher | 375/10 |
| 3,973,112 | 8/1976 | Sloane | 364/553 |
| 4,067,060 | 1/1978 | Poussart | 364/553 |
| 4,168,485 | 9/1979 | Payton | 367/41 |
| 4,275,348 | 6/1981 | Bayer | 364/553 |
| 4,275,446 | 6/1981 | Blaess | 364/487 |
| 4,302,843 | 11/1981 | Bauernfeind | 375/10 |

*Primary Examiner*—Kenneth Wieder
*Assistant Examiner*—Jose M. Solis
*Attorney, Agent, or Firm*—Hill, Van Santen, Steadman & Simpson

[57] ABSTRACT

A method for measurement of transmission characteristics consists of supplying a test pulse to an object under test and measuring the pulse at the output of the object under test with the assistance of Fourier analysis. The test pulse is made up of a plurality of components which are equally spaced apart in frequency, and the initial phase values of each of the components are chosen so as to reduce loading of the object under test to an acceptable level both at the input of the test object and its output. Evaluation of the test pulse at the output of the object under test yields attenuation and phase shift characteristics for each component frequency. Initial phase angles for the components of the test pulse are determined by taking into consideration the likely distortion in the test object in such a manner that a minimum crest factor is attained both in the tranmitted pulse and in the pulse received at the output of the test object.

8 Claims, 1 Drawing Sheet

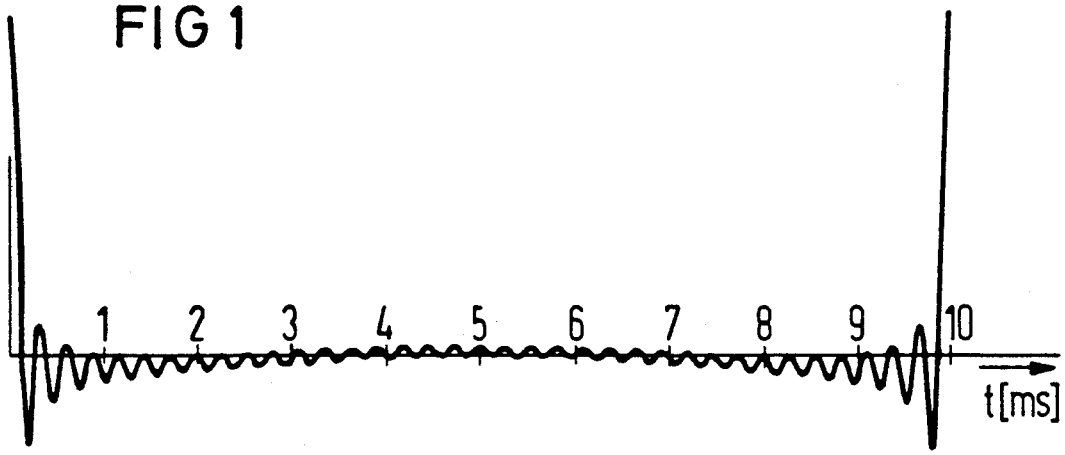
FIG 1
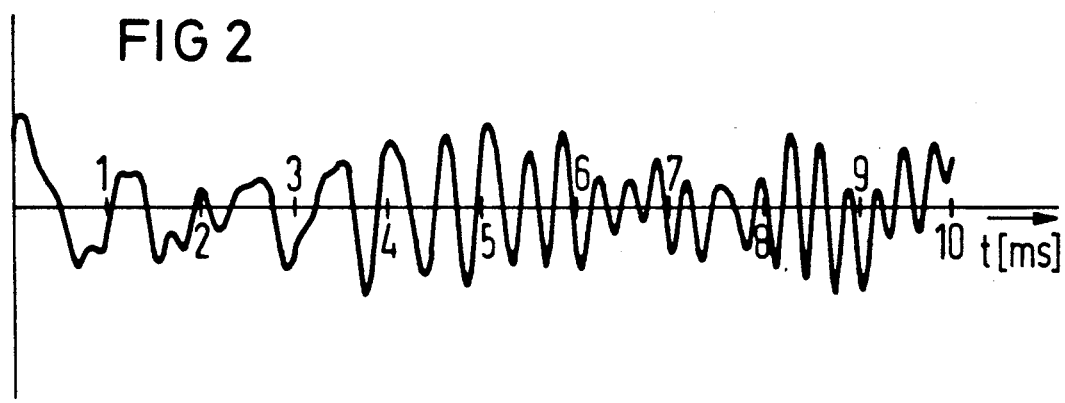
FIG 2
FIG 3
$A_n$   n=10,16,18,26,28,34
$A_n$   n=11,13,31,33
$A_n$   n=21,23,27,32
$A_n$   n=14,19,25,30
$A_n$   n=9,12,20,24,35
$A_n$   n=2,3,4,5,6,8,15,22,29,36
$A_n$   n=7,17

METHOD FOR MEASUREMENT OF ATTENUATION AND DISTORTION BY A TEST OBJECT

BACKGROUND OF THE INVENTION

1. Field of the Invention

This invention relates to a method and apparatus for the measurement of attenuation and delay time distortion (group transit time distortion) in a test object to which a test pulse is supplied.

2. The Prior Art

It is known to test objects such as transmission lines or the like by applying a test pulse to one end of the object under test, and analysing the pulse when it is received at the output of the test object. At the output, the deformation of the test pulse is analysed by Fourier analysis, the output signal being split into harmonics to determine the individual frequency components in terms of their amplitudes and their phase relationships to each other. The test pulse consists of a series of components having different frequencies, each component having a predetermined amplitude and starting phase. The test pulse is formed in accordance with the following:

$$V(t) = \sum^n A_n \cdot \cos(2\pi \cdot n \cdot f \cdot t - \theta_n)$$

where $A_n$ is the amplitude and $\theta_n$ is the starting phase of each individual component. When the individual components are superimposed to form the test pulse, the crest factor is $$c_f = \frac{V_s \text{ (peak value)}}{V_{\text{eff}} \text{ (effective value)}}$$

the crest factor is reduced, so that the object under test is not overloaded, by the selection of different starting phase values $\theta_n$, in accordance with the method described in my application Ser. No. 088,091 filed Oct. 24, 1979, now U.S. Pat. No. 4,275,446, which is hereby incorporated by reference into this specification. That application deals with the problem of how the crest factor of the test pulse can be reduced by the selection of suitable starting phase values for the components of the test pulse. This is necessary in order to reduce the loading of the object under test as far as possible, to prevent overmodulation or other nonlinearities which could occur during the measuring process. When a test pulse with a relative high crest factor is used, a fault can be produced in the object under test which does occur in practice during the transmission of useful signals.

The method described in application Ser. No. 088,091 is carried out under the principle that the test pulse is optimized at the transmission end of the object under test, by selecting initial phase values for the components of the test pulse to yield the minimum crest factor. In practice, however this method does not lead to optimum results, because the object under test (such as a communications transmission line) alters the phases of the components to a greater or lesser degree, such that at the receiving end, the test pulse no longer contains the same relationships of the starting phase values, but instead other phase values which can lead to an undesired increase in the crest factor.

BRIEF SUMMARY OF THE INVENTION

A principal object of the present invention is to provide a method of selecting starting phase values for the test pulse in such a way that the lowest possible crest factor is attained both in the transmitted pulse and in the received pulse received at the output of the test object The test pulse formed in accordance with the present invention takes into account both the transmitting end and the receiving end phase distribution with regard to the crest factor Therefore, no impermissibly high crest factor values are attained either at the transmitting end or at the receiving end, and disturbances or difficulties arising due to over modulation or nonlinearity of the test object can be avoided to a greater extent.

In accordance with one embodiment of the present invention, the phase distortions of the test object, as a function of frequency, are taken into account in determining the optimum distribution of the initial phase values, so that shifting of such phase values during the transmission of the test pulse leads to shifts in phase which essentially cancel each other out and yield a lower crest factor during the transmission and at the receiving end of the test object.

The frequency relationship of phase distortions in a test object are normally available either as a result of initial rough measurements, such as with the method described in the aforementioned application, or by consulting the specification and design criteria of the test object. For example, in the case of a transmission line, it can be assumed that a relatively constant relationship exists between phase distortion and the frequency, in the frequency band during which communication transmission occurs. Using these relationships which are approximately known for the test object, a test pulse which has been selected with a specific phase distribution can either be acutally measured at the receiving end, or the result of the test pulse at the receiving end can be estimated by means of calculation or plotting. This analysis permits the crest factor at the transmitting end $C_{fs}$ to be compared with the crest factor $C_{fe}$ at the receiving end, and by variation of the initial phase angles, one can determine the phase relationship for the starting test pulse which optimizes the crest factors at the transmitting end and the receiving end.

These and other objects and advantages of the present invention will become manifest by a review of the following description and the accompanying drawings.

DESCRIPTION OF THE DRAWINGS

Reference will now be made to the accompanying drawings in which:

FIG. 1 illustrates a test pulse made up of a number of components each having an initial phase angle $\theta_n = 0°$;

FIG. 2 illustrates a test pulse having a number of components with initial phase angles selected in accordance with the present invention;

FIG. 3 is vector diagram in the complex frequency plane for the test pulse illustrated in FIG. 2.

FIG. 4 is a functional block diagram of apparatus for carrying out the method of the present invention.

DESCRIPTION OF THE PREFERRED EMBODIMENT

The test pulse illustrated in FIG. 1 has a duration of 10 ms, and is composed of 35 harmonics each of the same amplitude A, in accordance with the following:

$$V(t) = \sum_{n=2}^{n=36} A \cdot \cos(2\pi \cdot n \cdot f \cdot t)$$

the initial phase angle $\theta_n$ of each component is set to zero, so that 35 in-phase cosine oscillations are superimposed. The fundamental frequency is assumed to be 100 Hz, but the fundamental has been omitted, so that only the 35 consecutive harmonics are present in the test pulse, viz; n=2 to n=36. The amplitudes of all components are equal.

The crest factor for the test pulse of FIG. 1 is $C_f = \sqrt{2x}$, where x is the number of existing harmonics (35 in the example of FIG. 1). For the test pulse of FIG. 1, $C_f = 8.37$.

The frequency covered by the test pulse extends from 200 Hz to 3.6 KHz, in stages of 100 Hz, and therefore precisely covers a telephone channel together with boundry zones of interest.

If the period boundries of the test pulse are displaced by the time $t_0$, a starting phase is obtained for each cosine component, and the test pulse can be represented by the following equation:

$$V(t - t_0) = \sum_{n=2}^{36} A \cdot \cos[2\pi n f(t - t_0)] = \sum_{n=2}^{36} A \cdot \cos[2\pi n f t - n\theta]$$

where we have $\frac{T}{t_0} = \frac{2\pi}{\theta}$ or $t_0 = \frac{\theta \cdot T}{2\pi} = \frac{\theta}{2\pi f}$ the period T is the reciprocal of frequency or $$T = \frac{1}{f},$$

the period of the fundamental frequency f. The crest factor is not changed as a result of this time shift and the overall test pulse, and the voltage waveform remains the same.

On the basis of this consideration, it is possible to formulate a mathematical interrelationship in the event of a shift in period boundries. In order to reduce the crest factor at the receiving end, the values used for the starting phases $\theta_n$ of the cosine oscillations are those which result in an improvement of the crest factor both at the transmitting end and at the receiving end. An improvement solely at the transmitting end is inadequate, since the phase shift in the test object produces additional changes in the crest factor which can transform a test pulse which is optimum at the transmitting end and to a distorted pulse at the receiving end having a poorer crest factor. Thus it is insufficient to take only into account the transmitting end for selection of the initial phase angles of the test pulse components. Rather, it is additionally necessary to take into consideration the influence of the test object, and to use a test pulse which produces good values both at the transmitting end and at the receiving end. To this end, the present invention employs generally valid dimensioning rules which are described in detail in the following.

In one embodiment of the present invention, which yields a test pulse which is particularly advantageous for the optimization of both the transmitting end and the receiving end crest factor in a communications transmission line, employs k discrete values of starting phases which are uniformly distributed over the entire angle which is permitted for the cosine oscillation. Thus in the case of x harmonic oscillations actually present in the test pulse, the starting phase values $\theta_n$ follow the rule:

$$\theta_n = (n - 1) \cdot \frac{2\pi}{k} \cdot m$$

where m is 0 to (k−1) in whole numbered values, i.e. m=0, 1, 2, 3, . . . (k−1). This largely avoids the disadvantage arising from too greatly compensating the initial starting phases of the test pulse components which result in an undesired increase in the crest factor at the receiving end. In accordance with k discrete permanent phase values, the phases of the harmonics are selected so that the large amplitude peak which exists in the test pulse of FIG. 1 is distributed among k times during each period.

Referring to FIG. 2, it can be seen that the individual amplitude peaks are much less prominent than the signal peak of FIG. 1, which in itself represents an improvement in the crest factor. In the example of FIG. 2, the components of which are identified in the vector diagram of FIG. 3, the following numerical values have been used. The total number of 35 harmonic individual components (beginning with 2f=200 Hz and ending with 36f=3.6 kHz, which is the same distribution as in FIG. 1) are divided into k=7 groups so that each group comprises 5 harmonics. Thus in the example of FIG. 2, the following equation applies, where F=100 Hz, the fundamental frequency, and $A_n = 1$:

$$V(t) = \sum_{n=2}^{36} A_n \cdot \cos(2\pi n f t - \theta_n)$$

The 35 harmonics making up the test pulse cover one telephone channel. The various starting phases $\theta_n$ are calculated in accordance with equation 5 as:

$$\theta_n = (n - 1) \cdot \frac{2\pi}{7} \cdot m.$$

the value of n starts with n=2, in accordance with the first harmonic 2f, and proceeds to the value having the highest frequency which in the present example is n=36.

When m=0, the starting phases of $\theta_n = 0$ are obtained for the first five $$\left(\frac{35}{7} = 5\right)$$

harmonics 2f, 3f, 4f, 5f and 6f. Thus in the case in the first group of components, cosine signals are employed having initial phase angle 0°, so that there voltage maximum occurs at t=0.

The second group of components comprises 7f, 8f, 9f, 10f, and 11f. For the first of these components 7f, the initial phase angle is:

$$\theta_7 = \frac{(7 - 1) 2\pi}{7} \cdot 1 \approx 308°$$

the initial phase angle for 8f is calculated as:

$$\theta_8 = \frac{(8-1)2\pi}{7} \cdot 1 \approx 360° = 0°$$

the initial phase angle for 9f is calculated as:

$$\theta_9 = \frac{(9-1)2\pi}{7} \cdot 1 \approx 52°$$

In similar fashion, the phase angles for 10f and 11f are 104° and 156°.

The phase angles for the third group where m=2 begin at 12f and extend to 16f. The initial phase angles for these components are calculated in similar fashion for example:

$$\theta_{12} = \frac{(12-1)2\pi}{7} \cdot 2 \approx 1131° = 52°$$

The other initial phase angles are calculated in a similar manner, and their relationships are illustrated in the vector diagram of FIG. 3

The test pulse obtained in this way has a crest factor $C_{fs}=2.37$ which is very low, and is therefore very advantageous at the transmitting end. At the same time however the phase distribution effected in accordance with the present invention insures that a typical communications transmission line does not produce changes in the crest factor which are so severe that the crest factor in the receiving end test pulse $C_{fe}$ does not reach a value of such magnitude which differs materially from the transmitting end value. Thus the test pulse illustrated in FIG. 2 represents the optimum solution, considering both the transmitting end and the receiving end, and such pulse can be used with particular advantage in communications measuring technology.

The changes which can influence crest factor as a result of phase distortions produced during measurement of a test object are partially compensated in the test pulse of FIG. 2 and do not lead to impermissibly high voltage peaks at the receiving end. The influence of test objects in the phase angles of the components produce result which largely compensate for each other, so that the good crest factor which prevails at the transmitting end is substantially retained at the receiving end.

In order to simplify use of the present invention, it is advantageous that a constant principle be employed for selecting the initial phase angles, for communications transmission lines which represent increases in phase distortion as a function of frequency. Such a principle can be generalized for the present invention as follows. The starting phase angles $\theta_n$ are distributed between k discrete fundamental values, and the angular separation between two successive fundamental values is $$\frac{2\pi}{k}.$$

It can be expedient to select the value for $$\frac{2\pi}{k} = \pm 45°.$$

The starting phase angle $\theta_n$ for the components are determined by the equation:

$$\theta_n = g(n) \cdot \frac{2\pi}{k} \cdot m,$$

where g(n) represents a value which increases with the ordinal number n, k represents a whole number which is smaller than n, and m assumes consecutively the values between 0 and (k−1), the same value m in each case applying to $$\frac{x}{k}$$

harmonics, where x represents the number of the harmonics actually present in the test pulse.

Particularly simple realizations of test pulses are obtained where g(n) represents a linear function. When only (n−y) harmonics exist, and y represents the fundamental wave and any following harmonics, the function g(n) is formed by the factor (n−y).

The value of k is advantageously selected to be such that the quotient $$\frac{x}{k}$$

results in a whole number.

It will apparent to others skilled in the art that various modifications and additions may be made in the process of the present invention without departing the essential features of novelty thereof which are intended to be defined and secured by the appended claims.

What is claimed is:

1. A method for measuring the transmission properties of a test subject to which a test pulse of finite duration is supplied and the deformation of said test pulse caused by the test subject is interpreted, whereby the pulse reply is dissected with a computer with the assistance of Fourier analysis and whereby the transmission properties of the test subject are identified from said test pulse, comprising the steps of:

forming said test pule by superimposing for said duration, a series of (x) differing consecutive harmonics of a frequency f having amplitudes and starting phases according to the following equation $$V(t) = \Sigma A_n \cos(2\pi \cdot n \cdot f \cdot t - \theta_n)$$

whereby $A_n$ denotes the amplitude of the nth component and $\theta_n$ denotes the value of the starting phase of the nth harmonic n·f, whereby the values of the starting phase $(\theta_n)$ are distributed into an integral number k groups of components, with each group having an integral number of components equal to x/k, each group having a unique phase-spacing parameter m taken from the set (0, 1 . . . k−1) with m=0 for the first group and m= k−1 for the kth group, whereby the starting phase $\theta_n$ of the harmonics is determined by the relationship $$\theta_n = g(n) \frac{2\pi}{k} m,$$

in which g(n) represents a value increasing with increasing ordinal number n;

and applying said test pulse to said test subject, whereby the deformation of said test pulse caused by said test subject may be interpreted.

2. The method according to claim 1, wherein said forming step includes the step of selecting said harmonics for superimposition by selecting a value of k which is smaller than n.

3. The method according to claim 1, wherein g(n) represents a linear function.

4. The method according to claim 3, wherein g(n) is formed by the factor (n−y), where n−y components are employed, y representing the fundamental wave in any following harmonic.

5. The method according to claim 1, wherein k is a submultiple of x so that $$\frac{x}{k}$$

results in an integer.

6. The method according to claim 1, wherein k=7 and x=35, and harmonics extend from n=2 to n=36.

7. The method according to claim 1, wherein the harmonics are spaced apart by intervals of 100 Hz.

8. The method according to claim 1, wherein the amplitude of one or more components, including the fundamental f, is set at 0.

* * * * *